United States Patent [19]

Nakano

[11] Patent Number: 5,531,315

[45] Date of Patent: Jul. 2, 1996

[54] APPARATUS FOR CARRYING EXTRA-THIN PRINTED BOARDS, ETC.

[75] Inventor: Teruyuki Nakano, Hiroshima-ken, Japan

[73] Assignee: Kabushiki Gaisha Ishii Hyoki, Hiroshima, Japan

[21] Appl. No.: 288,907

[22] Filed: Aug. 11, 1994

[30] Foreign Application Priority Data

Aug. 12, 1993 [JP] Japan .................................. 5-232598

[51] Int. Cl.[6] ............................................. B65G 17/16
[52] U.S. Cl. ...................................... 198/779; 193/35 R
[58] Field of Search ................................... 193/35 R, 37; 198/780, 779

[56] References Cited

U.S. PATENT DOCUMENTS

| | | | |
|---|---|---|---|
| 1,669,497 | 5/1928 | Steegmuller | 198/35 R X |
| 3,744,111 | 7/1973 | Stumpf | 198/780 X |
| 3,770,103 | 11/1973 | Ball et al. | 198/780 X |
| 4,645,056 | 2/1987 | Palazzolo et al. | 193/37 X |
| 4,681,203 | 7/1987 | Kornylak | 193/35 R |
| 5,123,522 | 6/1992 | Comly, Jr. | 198/779 |

*Primary Examiner*—James R. Bidwell
*Attorney, Agent, or Firm*—Lane, Aitken & McCann

[57] ABSTRACT

The present invention is characterized by an apparatus for carrying extra-thin printed boards, etc., wherein a plurality of rotation axles are oriented in a direction perpendicular to a carrier direction in which the printed boards are to be carried, a plurality of disks are fixed to each of the rotation axles at suitable intervals, each disk having opposed side faces having rims, the disks on adjacent axles in a carrier direction partially overlapping one another in the direction in which the printed boards are to be carried and being free from interference with each other. A plurality of supporting shafts are provided at the rims of right and left side faces of each disk, the supporting shafts on disks on axles which are adjacent to one another overlap one another by a fixed length but not interfering with one another.

6 Claims, 2 Drawing Sheets

APPARATUS FOR CARRYING EXTRA-THIN PRINTED BOARDS, ETC.

The present invention relates to an apparatus for carrying extra-thin printed boards, etc.

BACKGROUND OF THE INVENTION

FIG. 3(a) shows an example of a typical carrying device for conveying an extra-thin printed board whose thickness is some dozens of microns. Rollers 1 having smooth contact surfaces 1a are juxtaposed in a carrier direction f1. FIG. 3(b) shows another example, wherein rotation axles 2 are juxtaposed in a carrier direction, and disks 3 are provided on the rotation axles 2 with suitable intervals.

When carrying extra-thin printed boards with these devices, the extra thin printed boards are placed on the rollers 1 or disks 3 to be driven and rolled, and said printed boards are conveyed by a rolling force of the roller 1, etc.

PROBLEMS

In the above conventional carrying devices, there are problems that the extra-thin printed board to be carried falls off the rollers 1 or the disks 3, that the printed board is stuck between the rollers 1 or the disks 3, and that the printed board winds around or is caught on the rollers 1 or the disks 3.

These problems happen especially when water or chemicals are sprayed on the extra-thin printed boards while they are being carried.

SUMMARY OF THE INVENTION

Therefore, objects of this invention are to overcome the above problems, and to provide an apparatus for rationally and smoothly carrying even an extra-thin printed board whose thickness is only some dozens of microns.

To achieve the above objects, the present invention is characterized by an apparatus for carrying extra-thin printed boards, etc., wherein a plurality of rotation axles are juxtaposed in a direction perpendicular to a carrier direction, a plurality of disks are fixed to each of said rotation axles at suitable intervals, said disks on adjacent axles in a carrier direction partially overlapping but not interfering with each other from their side view, and a plurality of supporting shafts are provided at the rims of each disk, on right and left side faces of each disk, said supporting shafts on adjacent disks in a carrier direction overlapping in a fixed length but not interfering with each other when viewed in the carrier direction.

In this case, it is preferable that the pitch of the rotation axles and the diameter of the disk are suitably set within the range of 38 mm~56 mm and 60 mm~70 mm, respectively, and four to eight supporting shafts are provided at fixed intervals.

While the printed boards are being carried, they are carried horizontally and smoothly, because the supporting shafts support them almost horizontally between the disks, imposing a carrier force relative to the disks on the printed board.

DETAILED DESCRIPTION OF PREFERRED EMBODIMENT

Figure 1:
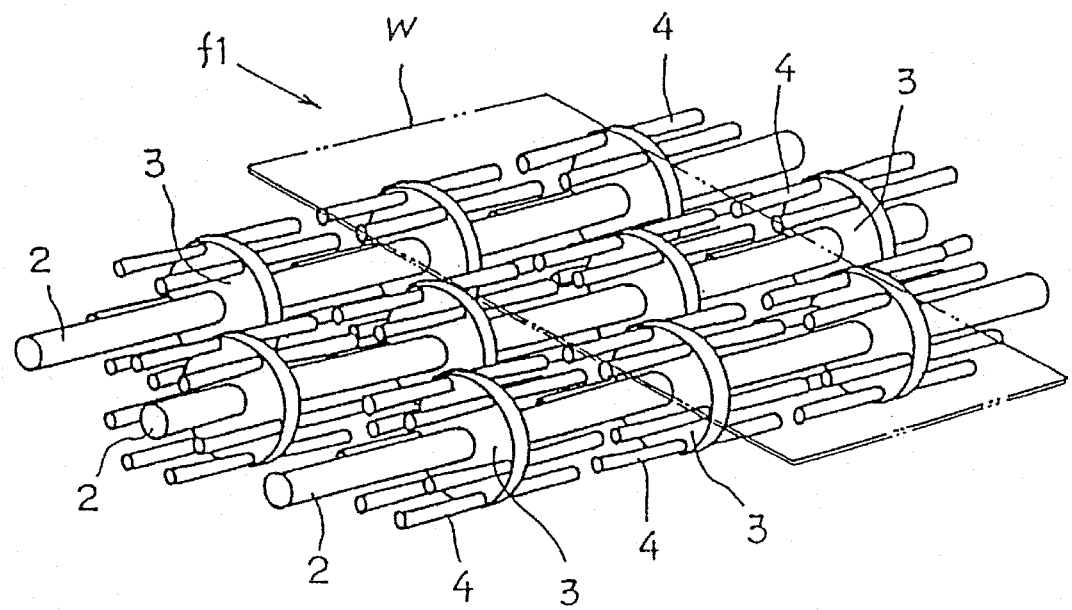
FIG. 1 is a perspective view of the main parts of a carrying device according to one embodiment of the present invention.
Figure 2:
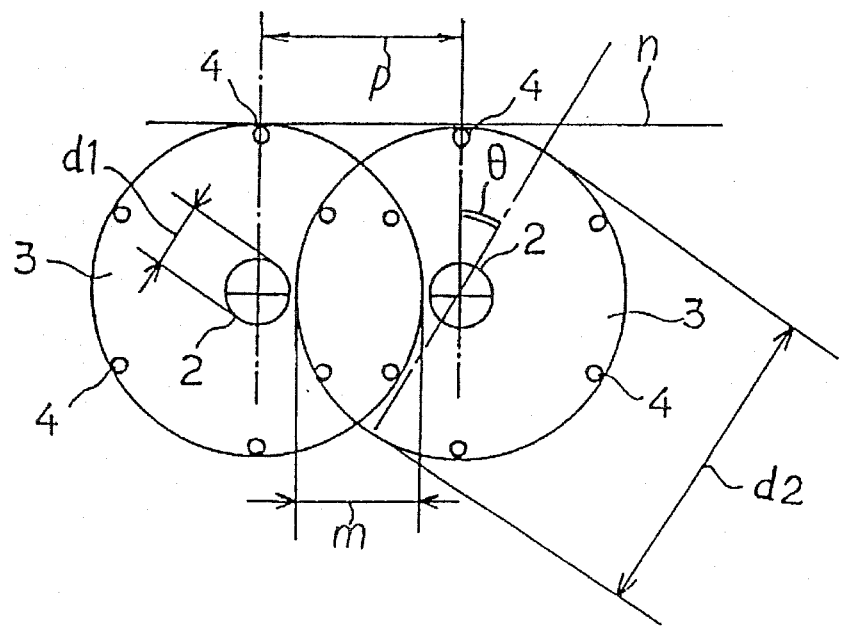
FIG. 2 is a side elevational view of the carrying device of FIG. 1, showing the relationship between adjacent disks.
Figure 3A:
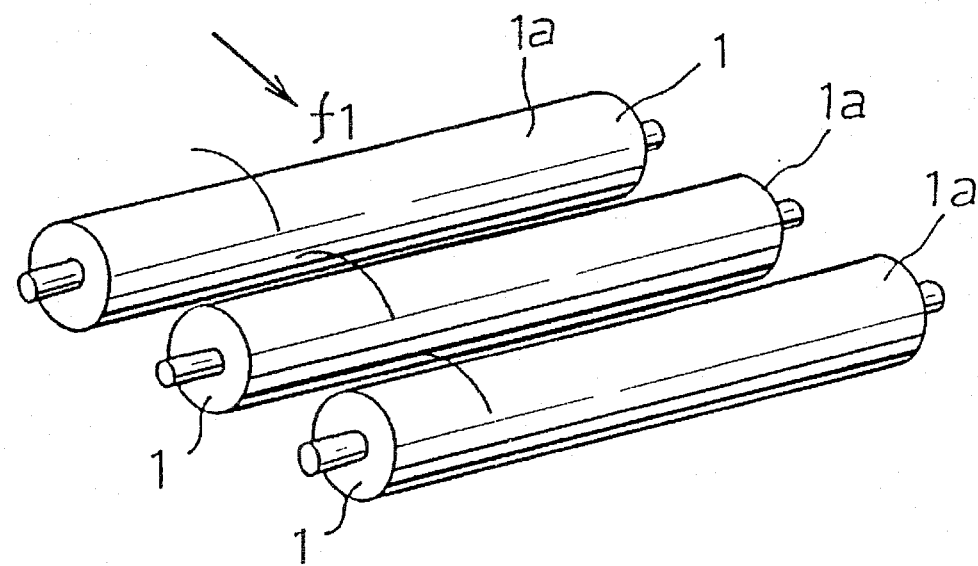
FIG. 3(a) is a perspective view of a typical carrying device for conveying an extra-thin printed board.
Figure 3B:
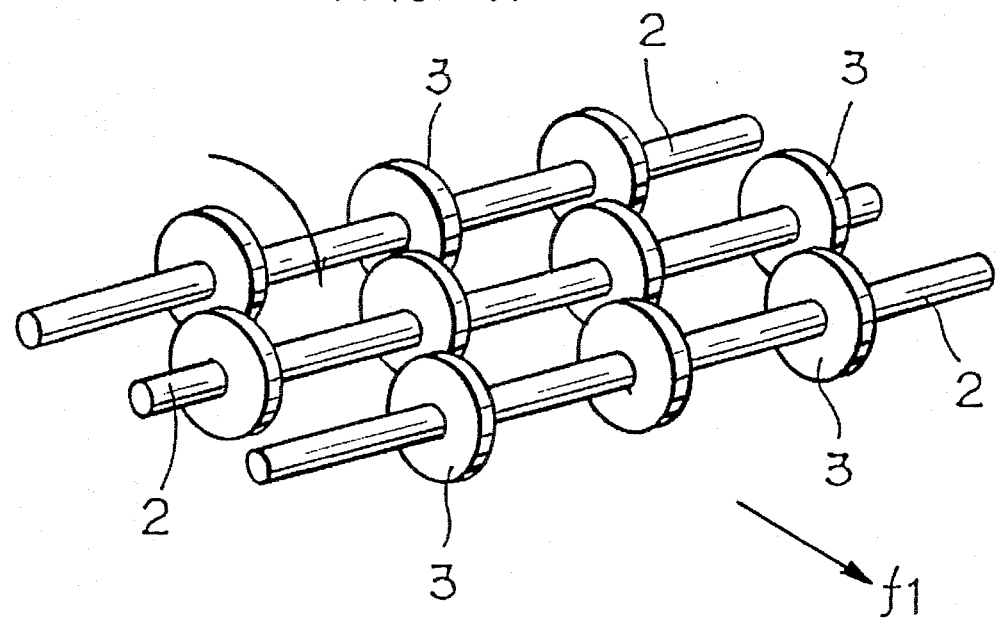
FIG. 3(b) is a perspective view of another example of a typical carrying device for conveying an extra-thin printed board.

FIG. 1 is a perspective view of a main part of a carrying apparatus according to one embodiment of the present invention. FIG. 2 is a side elevational view of the above apparatus, showing a relationship between adjacent disks. The same numerals and marks are given to the same parts as the conventional example.

In those figures, rotation axles 2 are rotatably supported by means of frames which are not shown here.

Disks 3 on adjacent axles in a carrier direction partially overlap with each other in a fixed length "m" but do not interfere with each other. In this case, it is preferable that each disk 3 on an axle 2 is provided midway between the disks 3 on the next axle 2 in a carrier direction f1.

A plurality of supporting shafts 4 are provided at the rim of each disk 3 in a direction of rotation of the axle 2 at suitable intervals. In this case, the supporting shafts 4 on adjacent disks 3 in a carrier direction "f1" overlap by a fixed length, but do not interfere when viewed in the carrier direction.

When thus constructed, the carrying device is used for conveying an extra-thin printed board "w" (whose thickness is some dozens of microns, for example). It is necessary to set up the dimension of each part suitably. The following are two patterns to examine the dimension.

(1) The First Pattern:

A diameter d1 of the rotation axle 2 is 12 mm, a phase shift θ of the rotation axle 2 is 0 (a state shown in FIG. 2); a diameter d2 of the disk 3 is 60 mm; six supporting shafts 4 are fixed to one disk 3; a diameter of each supporting shaft 4 is about 3 mm, and the rotation axles 2 are rotated at the same speed with the same angle. Here, "a phase shift θ of the rotation axis" indicates that when a supporting shaft 4 of a disk 3 fixed to a rotation axle 2 stays at a top position, in what degree a supporting shaft 4 of a disk 3 fixed to the next rotation axle 2 proceeds from said top position.

Under the above condition, it is the most preferable to set up a pitch "p" of the rotation axle 2 within the range of 38 mm~39 mm. If the pitch "p" is shorter than 38 mm, the rim of the disk 3 and periphery of the rotation axle 2 become too close, so that the disk 3 may interfere with the rotation axle 2 if considering eccentrics of the rotation axle 2. On the other hand, if the patch is bigger than 39 mm, the supporting shafts 4 of the disks 3 on adjacent rotation axle 2, 2 may interfer with each other during rotations of the disks 3.

(2) The Second Pattern:

In the second pattern, the diameter d2 is 70 mm, and the other dimensions are the same as the first pattern.

Under this condition, it is the most preferable to set up the pitch "p" of the rotation axle 2 within the range of 43 mm~48 mm.

Judging from the above results, it is rational to make the diameter "d2" of the disk 3 70 mm rather than 60 mm, because the number of the rotation axles 2 and the disks 3 can be reduced.

When operating the present invention, each rotation axle 2 is slowly rotated by a suitable source and then extra-thin printed boards "w" etc. are placed on the rotation axles 2 from their carriage starting side. In this case, the peripheries of the disks 3 and the supporting shafts 4 support the whole lower face of the printed board "w" almost evenly as well as impose a carriage force on the whole lower face almost evenly. Accordingly, the printed boards "w" can be conveyed smoothly along a carriage line "n" without falling between the rotation axle 2, rolling to or being caught by the rotation axles 2 and the disks 3.

If water or chemicals are sprayed on the printed boards "w" from above or even below the rotation axles 2 and the disks 3 while the printed boards are being carried, the water or chemicals can reach an upper or lower face of the printed board "w" effectively, since neither the rotation axles 2 nor the supporting shaft 4 prevents spray a great deal. Besides, the printed boards "w" are evenly supported by the supporting shafts 4 etc., thereby bringing effective treatments to them without any careless curvature.

As described in the above, the present invention can stably and smoothly carry extra-thin printed boards whose thicknesses are even some dozens of microns. Besides, both the upper and lower faces of the printed boards can be effectively treated with water or chemicals while they are being carried.

I claim:

1. Apparatus for carrying extra-thin printed boards and the like, comprising:

a plurality of rotation axles oriented in a direction perpendicular to a direction in which the printed boards are to be carried;

a plurality of disks fixed at intervals to each of said rotation axles, each said disk having opposed side faces having rims, said disks on said axles which are adjacent to one another overlapping one another in the direction in which the printed boards are to be carried and being free from interference with one another; and a plurality of supporting shafts positioned on said disks at said rims, said supporting shafts on said disks on said axles which are adjacent to one another overlapping one another by a fixed length and being free from interference from one another.

2. An apparatus according to claim 1, wherein a pitch of the rotation axles and a diameter of the disks are within the ranges of 38 mm–56 mm and 60 mm–70 mm, respectively, and four to eight supporting shafts are provided at the rims of the side faces of the disks at suitable intervals.

3. An apparatus according to claim 1, wherein said supporting shafts have relatively small radii and protrude symmetrically from the side faces of the disks.

4. An apparatus according to claim 1, wherein a plurality of said supporting shafts protrudes from each of said opposed side faces of said disks.

5. An apparatus according to claim 4, wherein the supporting shafts on each of said side faces of the disks are spaced uniformly with respect to one another.

6. An apparatus according to claim 4, wherein a first plurality of said supporting shafts protrudes a first distance from one of the opposed side faces of said disks, and a second plurality of said supporting shafts protrudes a second distance from the other of the opposed side faces of said disks, said first distance being generally equal to said second distance.

* * * * *